(12) United States Patent
Corisis

(10) Patent No.: US 6,423,624 B1
(45) Date of Patent: Jul. 23, 2002

(54) BALL ARRAY LAYOUT

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/631,259

(22) Filed: Aug. 2, 2000

Related U.S. Application Data

(62) Division of application No. 09/388,706, filed on Sep. 2, 1999, now Pat. No. 6,249,047.

(51) Int. Cl.$^7$ .............................................. H01L 21/44
(52) U.S. Cl. .................. 438/612; 438/15; 438/16; 438/17; 438/611; 438/613; 257/697; 257/698; 257/700; 257/784; 257/786
(58) Field of Search .................................. 438/612, 611, 438/613, 15, 16, 17; 257/691, 697, 698, 700, 784, 786

(56) References Cited

U.S. PATENT DOCUMENTS

| | | | |
|---|---|---|---|
| 4,551,789 A | 11/1985 | Schettler et al. ............ 361/406 |
| 5,214,845 A | 6/1993 | King et al. .................... 29/841 |
| 5,278,524 A | 1/1994 | Mullen .......................... 333/1 |
| 5,696,667 A | 12/1997 | Berding ....................... 361/788 |
| 5,847,451 A | 12/1998 | Ohtaki et al. ............... 257/697 |
| 5,854,534 A | 12/1998 | Beilin et al. ................. 257/697 |
| 5,859,474 A | 1/1999 | Dordi .......................... 257/737 |
| 5,886,409 A | 3/1999 | Ishino et al. ................ 257/737 |
| 5,903,050 A | 5/1999 | Thurairajaratnam et al. ........................... 257/695 |
| 5,952,726 A | 9/1999 | Liang ......................... 257/691 |
| 6,046,496 A | * 4/2000 | Corisis et al. .............. 257/675 |
| 6,048,753 A | 4/2000 | Farnworth et al. .......... 438/111 |
| 6,064,113 A | 5/2000 | Kirkman ..................... 257/691 |
| 6,072,126 A | 6/2000 | Shiga et al. ................. 174/250 |
| 6,079,620 A | 6/2000 | Wu et al. .................... 361/760 |
| 6,096,980 A | 8/2000 | Ferry ......................... 361/777 |
| 6,103,548 A | 8/2000 | Miks et al. ................. 438/106 |
| 6,229,202 B1 | * 5/2001 | Corisis ....................... 257/666 |
| 6,232,666 B1 | * 5/2001 | Corisis et al. .............. 257/774 |

* cited by examiner

Primary Examiner—David Nelms
Assistant Examiner—Reneé R Berry
(74) Attorney, Agent, or Firm—Workman, Nydegger & Seeley

(57) ABSTRACT

The present invention relates to a ball array capacitance minimizing layout that includes a ball array disposed upon a substrate with trace routing laid out between each ball pad and a respective bond wire pad. After routing of both signal and ground traces between the ball pads and their respective bond wire pads, at least one buffer trace is also disposed upon the substrate as a closed loop. The buffer trace may or may not be connected to ground. Preferably, buffer traces are configured to reduce the capacitance of the highest capacitance ball pads. This is accomplished by placing more of a give buffer trace around the perimeter of a higher capacitance ball pad, that around the perimeter of a lower capacitance ball pad. Accordingly, a capacitance difference between a higher capacitance ball pad and signal trace and a lower capacitance ball pad and signal trace can be minimized according to the present invention.

8 Claims, 9 Drawing Sheets

BALL ARRAY LAYOUT

RELATED APPLICATIONS

This application is a divisional of U.S. patent application Ser. No. 09/388,706, filed Sep. 2, 1999, now U.S. Pat. No. 6,249,047, which is incorporated herein by reference.

BACKGROUND OF THE INVENTION

1. The Field of the Invention

The present invention relates to microelectronic device packaging. More particularly, the present invention relates to achieving a ball array and trace layout that enhances signal processing with the packaged microelectronic device. In particular, the present invention relates to a ball array and trace layout electrical enhancement technique that achieves a preferred difference in capacitance between any two ball pad sites and their respective traces for a printed circuit board ball array.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

As device operating speeds and the slew rates of driver switching simultaneously increase, the quality of the power $V_{cc}$ and ground $V_{ss}$ routing systems become a critical factor in the overall integrity of the system In current designs, providing a source of charge in close vicinity of the switching activity is essential for the proper functioning of an overall integrated circuit system.

Prior art systems have been able to somewhat improve electrical performance with discrete capacitive components. These discrete capacitive components are usually mounted on a package substrate and then directly interconnected to the power $V_{cc}$ and ground $V_{ss}$ through conductive leads and vias. However, a major problem with using discrete capacitive components to decouple the power $V_{cc}$ and ground $V_{ss}$ traces is that they lose their effectiveness at high frequencies. Furthermore, there is often not enough space on the semiconductor package surface to mount a larger number of discrete capacitative components that may be necessary to decouple the system.

Although it is a common practice to add ground shielding around signal traces in order to reduce cross-talk between electrically conductive traces that communicate with an electronic device, ground traces themselves can induce cross-talk with adjacent signal traces. Another practice is to remove all excess metal between signal traces that is not being used for ground shielding. The placement of ground traces between signal traces increases the amount of real estate that is required upon a given substrate such as a printed circuit board (PCB). Another problem that exists is that signal traces can be configured in a given ball pad column that includes a ball array and signal traces that are configured into a different ball pad column in the ball array. These configurations lend themselves to an increased capacitance difference between any given ball pad and its respective trace and any other ball pad and its respective trace.

A phenomenon that occurs during overmolding of an integrated circuit chip package is flashing of encapsulation material between a substrate and a mold half. The often irregular wiring layout that may be the result of autorouting or hand routing of traces between bond wire pads in a bond wire pad column, and ball pads in a ball pad column, may cause some spacing between traces to be large enough to allow flashing of encapsulation material.

What is needed in the art is a ball array and trace layout electrical enhancement technique that overcomes the foregoing problems of prior art

SUMMARY OF THE INVENTION

The present invention relates to a ball array layout that minimizes the capacitance difference between any given ball pad and its nearest ground in any other given ball pad and its nearest ground. The ball array layout includes a plurality of buffer traces, each buffer trace having a perimeter. The buffer traces are disposed around a plurality of ball pads that are arranged in equally spaced columns and rows, respectively. The plurality of ball pads arranged in columns is disposed upon a substrate such as a printed circuit board (PCB), and each ball pad is the terminus of a conductive trace such as a signal trace, a ground trace, or a power trace. Each ball pad has an approximate center that is equally spaced from adjacent ball pads in both the respective columns and the respective rows. Each ball pad is aligned along a straight line to other ball pads in the respective column and to the other ball pads in the respective row. The present invention contemplates the columns to include a first column and a second column that lie parallel to each other. Each ball pad in the first column has a perimeter that is parallel to a first length of one of the plurality of buffer traces. At least one ball pad in the second column has a perimeter that is parallel to a second length of one of the plurality of buffer traces. Typically, the buffer trace second length is less than the buffer trace first length. In other words, the buffer trace may encircle most of the ball pads in the first column and may only partially encircle, to a lesser degree at least one of the ball pads in the second column.

In the present invention, a ball array and trace layout is configured to obtain a difference in capacitance of not more than about 0.06 picoFarads between any given ball pad and its corresponding trace and any other given ball pad and its corresponding trace. The present invention also relates to a ball array trace layout that minimizes capacitance between any given two ball pads and their respective traces by the placement of buffer traces near the ball pad and also adjacent at least one ground trace. The buffer trace is preferably a "floating" trace. In other words, the floating trace is not connected to ground, but rather provides a source to create inductance after a fashion that diminishes the inductive effect of any given ball pad and its corresponding trace upon any other given ball pad and its corresponding trace where the difference in capacitance between the two is preferably to be diminished below a certain design difference or "capacitive Delta".

In the present invention, a "ball pad column" is defined as a plurality of serially adjacent ball pads that are arrayed with their approximate centers aligned with a straight line. Each ball pad is also spaced evenly along the straight line. Typically the even spacing is created by a series of ball rows, that create the even spacing, and that are arrayed orthogonal to the ball pad column. Each ball row is likewise a plurality of serially adjacent ball pads that are arrayed with their approximate centers aligned with a straight line that is orthogonal to the straight line that defines the alignment of the ball pad column.

According to the present invention, a ball array and trace layout is provided that includes a substrate and a ball array such as a fifty-four (54) ball pad array that is arranged in double sets of nine rows and three ball pad columns, each set being situated on an opposite side of a slot for board on chip (BOC) structures. After the routing of the traces between the ball pads and their respective bond wire pads, the present invention locates buffer traces adjacent to bond pads, where the buffer trace preferably lies proximate to a ground trace.

Where the capacitance in the ball array and trace layout is the highest, it is preferable that there will be a greater number of buffer traces. For example, an outer ball pad column or in other words a column that lies farthest from the center of the printed circuit board may have the highest capacitance and therefore preferably has thereat the highest number of buffer traces to respectively adjacent bond pads. A middle ball pad column, or in other words a ball pad column that lies closest to the center of the printed circuit board may have the smallest capacitance and therefore would have a lower number of buffer traces that are adjacent to respective ball pads and their respective traces.

Where the ball array and trace layout comprises more than two ball pad columns, such as a layout having outer, inner, and middle ball pad columns, preferably the number of buffer traces that are adjacent to respective ball pads and their corresponding traces will be greater at the middle ball pad column but will be less at the outer ball pad column.

After the selection and routing of a ball array and their respective traces, the present invention relates to a method of placing buffer traces between the ball pads and their respective bond wire pads. The size of buffer traces, which are closed loop traces, are selected to minimize the capacitative Delta between any two given ball pads and their respective traces.

In an alternative embodiment of the present invention, a ground trace may be subdivided from an original largest possible closed loop in order to isolate any given ball pad or to diminish the capacitative effect of any given ball pad upon any other given ball pad that would have been proximal to the ground trace.

In a further embodiment of the present invention, subdivided ground traces may be further split or subdivided so as to form two adjacent traces, where each further subdivided buffer trace lies proximate or partially encircling of an adjacent ball pad.

The capacitative Delta of a ball array and trace layout may be further adjusted by selectively connecting or not connecting any given buffer trace to a ground trace. In other words, a large loop buffer trace that may lie proximate to several ball pads may or may not be connected to ground. Alternatively, any subdivided ground trace may also be connected or not connected to ground.

The angularity to which any ball pad is partially surrounded by one ore more adjacent buffer traces can be adjusted, where the adjacent buffer traces can include a combination of a floating buffer trace and a grounded buffer trace, or can include either a floating buffer trace or a grounded buffer trace.

Another embodiment of the present invention includes the placement of buffer traces between signal and ground traces. Such placement of buffer traces creates a uniformly small spacing between traces in order to provide for a better seal between the substrate and the mold half during overmolding such as asymmetrical overmolding.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to a ball array layout for electrical traces that minimizes the difference in capacitance between any two given ball pads and their respective traces. Preferably, where the inventive ball array and trace layout is applied to board on chip (BOC) structures, the capacitance difference ("capacitative Delta") is in a range from about 0.02 picoFarads to about 0.06 picoFarads.

One of the current design targets that is being worked toward is to achieve a capacitance difference ("capacitative Delta") that is from about 0.2 picoFarads to about 0.6 picoFarads experienced for any trace in an outer ball pad column and any trace in another ball pad column. For example, where a given signal trace has a 0.1 picoFarad capacitance, it is preferred that any other trace within the same ball array cannot be more than 0.04 picoFarads different in capacitance therefrom. Accordingly, a 0.1 pico-Farad capacitance for a given trace could not have any other trace in the same ball array with a capacitance less than 0.06 picoFarads or greater than 0.14 picoFarads. In other words, a signal trace that induces a 0.1 picoFarad capacitance upon a ground trace, if the entire ball array is within the target design, may not be coupled with any other signal trace that induces a capacitance upon its adjacent neighboring ground trace greater than 0.14 or less than 0.06 picoFarads.

Reference will now be made to the drawings wherein like structures will be provided with like reference designations. It is to be understood that the drawings are diagrammatic and schematic representations of the embodiment of the present invention and are not drawn to scale.

Figure 1:
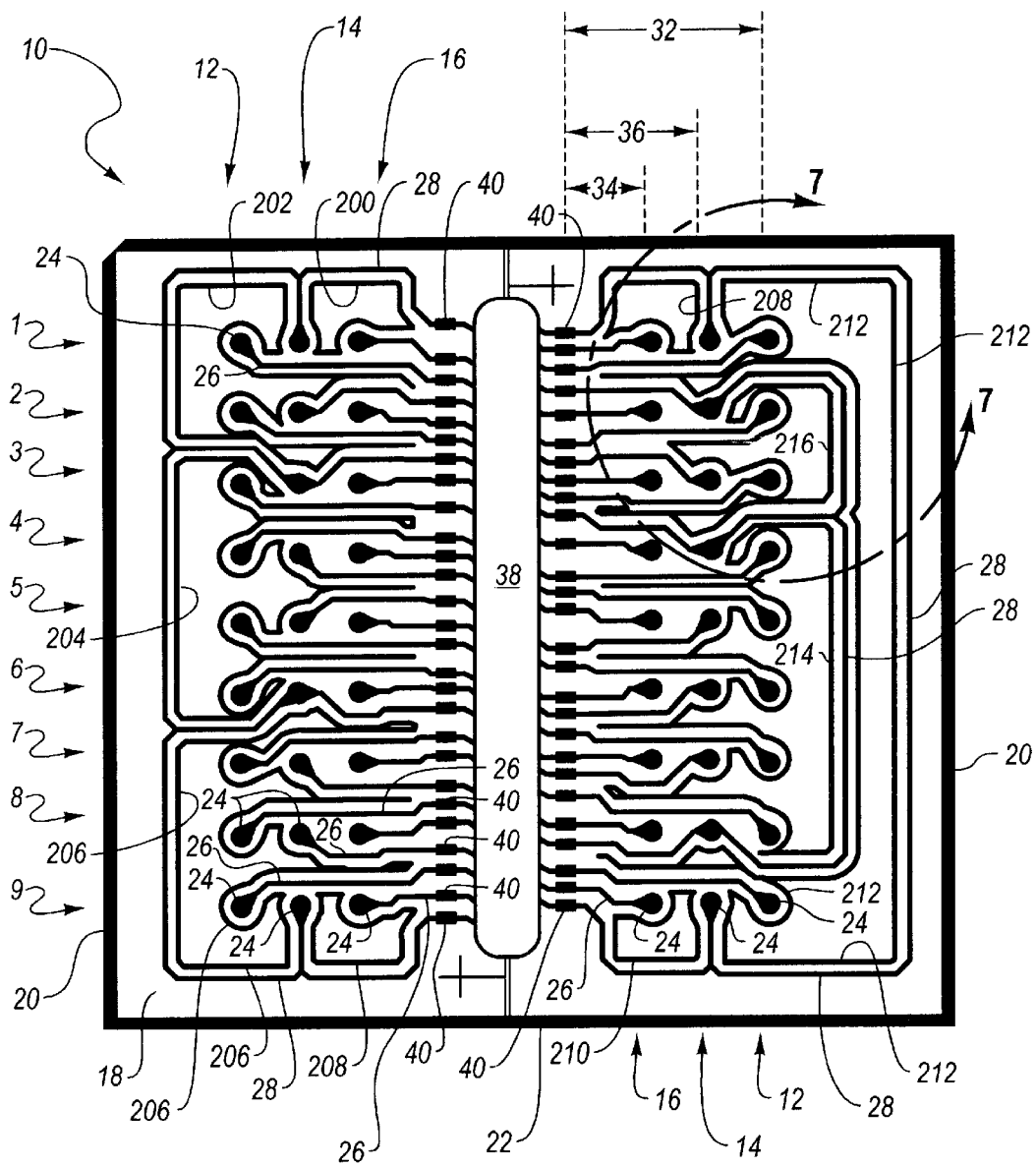
FIG. 1 is a plan view of an inventive ball array and trace layout.

FIG. 1 illustrates a ball array and trace layout 10 that includes a substrate 18 and a slot 38. Although ball array and trace layout 10 is depicted for BOC configuration, the inventive ball array and trace layout may be applied to other structures including chip on board (COB) structures and other wiring layouts used in the art.

Disposed upon substrate 18 is a ball array that includes a plurality of ball pad columns. In the present invention, a "ball pad column" is defined as a plurality of serially adjacent ball pads that are arrayed with their approximate centers aligned with a straight line. Each ball pad is also spaced evenly along the straight line. Typically the even spacing is created by a series of evenly spaced ball rows that are arrayed orthogonal to the ball pad column. Each ball row is likewise a plurality of serially adjacent ball pads that are arrayed with their approximate centers aligned with a straight line that is orthogonal to the straight line that defines the alignment of the ball pad column.

An outer or first ball pad column 12 is seen to run parallel to a vertical edge 20 of substrate 18. Further, an inner or second ball pad column 16 is disposed parallel to outer ball pad column 12 and adjacent and parallel to slot 38. Further, a middle or third ball pad column 14 is depicted as lying between outer ball pad column 12 and inner ball pad column 16. The size of the ball array depicted in FIG. 1, including the ball pads and signal traces connected thereto, is a non-limiting example. Also, a plurality of middle or third ball pad columns are contemplated to be situated between the inner and outer ball pad columns in alternative ball array and trace layouts where four or more ball pad columns are present.

As set forth above, the ball array may be described as a series of ball pad columns and ball rows. In ball array and trace layout 10, nine ball rows of three ball pads per row are indicated at the left of slot 38, where the nine ball rows consist of the ball pads in outer ball pad column 12, middle ball pad column 14, and inner ball pad column 16. A ball pad 24 marks the location for the terminus of a signal, power, or ground trace. Traces make electrical connection to a corresponding ball pad 24. Each ball pad 24 makes an electrical connection between ball pad 24 to a bond wire pad 40. A signal trace 26 may make a connection between bond wire pad 40 and ball pad 24. Signal traces can be one of three general lengths. The shortest signal trace 26 is depicted between bond wire pad 40 and ball pad 24 such as is seen in inner ball pad column 16 at the ninth row. An intermediate length signal trace 26 reaches between bond wire pad 40 and ball pad 24 located in middle ball pad column 14 such as is depicted at the eighth ball row and middle ball pad column 14. The longest signal trace 26 is seen in the eighth row between an occurrence of ball pad 24 and bond wire pad 40, where ball pad 24 is located at the intersection of the eighth row and outer ball pad column 12. Generally speaking, the variable length of traces may be illustrated as the distance between bond wire pad 40 and any given occurrence of ball pad 24 such as a trace length 32 of outer ball pad column 12, a column trace length 36 of inner ball pad column 16, and a trace length 34 of middle ball pad column 14.

In FIG. 1, a ground trace 28 forms an outer or peripheral wiring layout for either side of ball array and trace layout 10. On the left side of ball array and trace layout 10, ground trace 28 originates at a bond wire pad 40 and makes electrical connection to four ball pads 24.

Because of the stringent demands for a small capacitative Delta between any two given ball pads 24 and their respective signal traces, it was discovered that the placement of several buffer traces, 200, 202, 204, 206, 208, 210, 212, 214, 216, and 218, resulted in minimizing the capacitative Delta therebetween. Occurrences of buffer traces 200–218 are depicted as having a perimeter lying substantially parallel in part to occurrences of respective adjacent ground traces 28 and conforming in part the contour of several respective adjacent ball pads 24.

Each ball pad 24 depicted on the left side of FIG. 1 in outer ball pad column 12 is illustrated as being mostly surrounded by adjacent respective buffer traces 202, 204, and 206. Each ball pad 24 depicted on the left side of FIG. 1 in middle ball pad column 14 as partially surrounded or bordered proximate thereby with at least a single occurrence or two occurrences of buffer traces 200–208 that are adjacent thereto. By "partially surrounded" it is meant that a buffer trace is the closest conductive material to a given ball pad, that it lies in a contoured configuration to the ball pad shape, and that its perimeter lies parallel to greater than 50% of the perimeter of the given ball pad, or more, up to about 99%. By "bordered proximate" it is meant that a buffer trace is the closest conductive material to a given ball pad, that it lies in a contoured configuration to the ball pad shape, and that its perimeter lies parallel to roughly 50% of the perimeter of the given ball pad, or less. For each ball pad 24 depicted on the left side of FIG. 1 in inner ball pad column 16, all but two occurrences of ball pad 24 are depicted as having no occurrence of buffer traces 200–218 as the closest proximate adjacent trace thereto. Rather, the closest proximate trace of any of the signal, buffer, or ground traces is an occurrence of signal trace 26.

Each ball pad 24 depicted on the right side of FIG. 1 in outer ball pad column 12 is illustrated as being mostly surrounded by respective adjacent buffer traces 212, 214, 216, and 218. Each ball pad 24 depicted on the right side of FIG. 1 in middle ball pad column 14 as bordered proximate thereby with at least a single occurrence or two occurrences of respectively adjacent buffer traces 210, 212, 214, 216, and 218. For each ball pad 24 depicted on the right side of FIG. 1 in inner ball pad column 16, all but two occurrences of ball pad 24 are depicted as having no occurrence of buffer traces as the closest proximate trace thereto. Rather, the closest proximate trace of any of the signal, buffer, or ground traces is another occurrence of signal trace 26 or two occurrences of signal trace 26 that is respectively adjacent thereto.

In making the present invention, procedures can be carried out such as the selection of a ball array size. By way of nonlimiting example, a ball array size can be chosen with three columns by nine rows for a given half of a BOC printed circuit board layout. Autorouting of signal traces can then be carried out after the assignment of each occurrence of ball pad 24 for a given connection to a microelectronic chip through a respective bond wire pad 40. Hand routing may also be carried out. After autorouting or hand routing of traces between each bond wire pad 40 and its corresponding ball pad 24, layout designs can be made to achieve a capacitative Delta of 0.04 picoFarads or less by altering trace widths, trace lengths, trace shapes, and the routes of the signal trace between bond wire pad 40 and ball pad 24. Under those conditions, a capacitative Delta of about 0.046 picoFarads can be achieved. By the addition of the several occurrences of buffer traces 200–218, a capacitative Delta of about 0.02 picoFarads can be achieved for any two given occurrences of ball pad 24.

Figure 2:
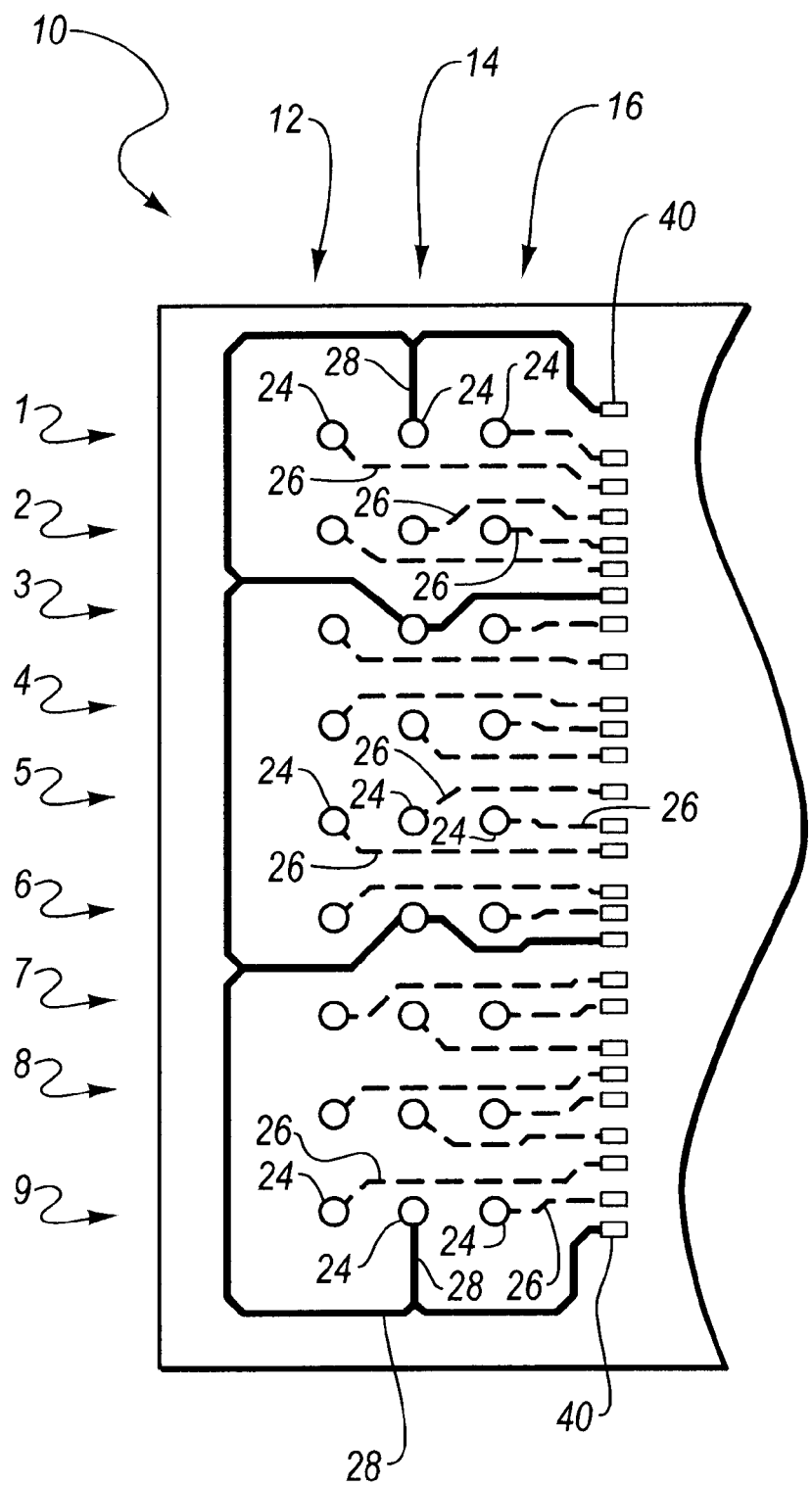
FIG. 2 is a detail study of a section of the ball array and trace layout depicted in FIG. 1 that shows in detail the wiring layout for both ground traces and signal traces that are connected to a plurality of bond wire pads.

FIG. 2 illustrates a portion of ball array and trace layout 10 depicted in FIG. 1. FIG. 2 illustrates 27 occurrences of ball pad 24 arrayed in nine rows and three columns. Ground trace 28 is depicted with a heavy continuous line and several occurrences of signal trace 26 are depicted as dashed lines for contrast, although it is understood that signal trace 26 is a continuous electrical connection between an occurrence of bond wire pad 40 and an occurrence of ball pad 24. The layout and routing of each occurrence of signal trace 26 is selected according to the specific application for a given Microelectronic chip.

Figure 3:
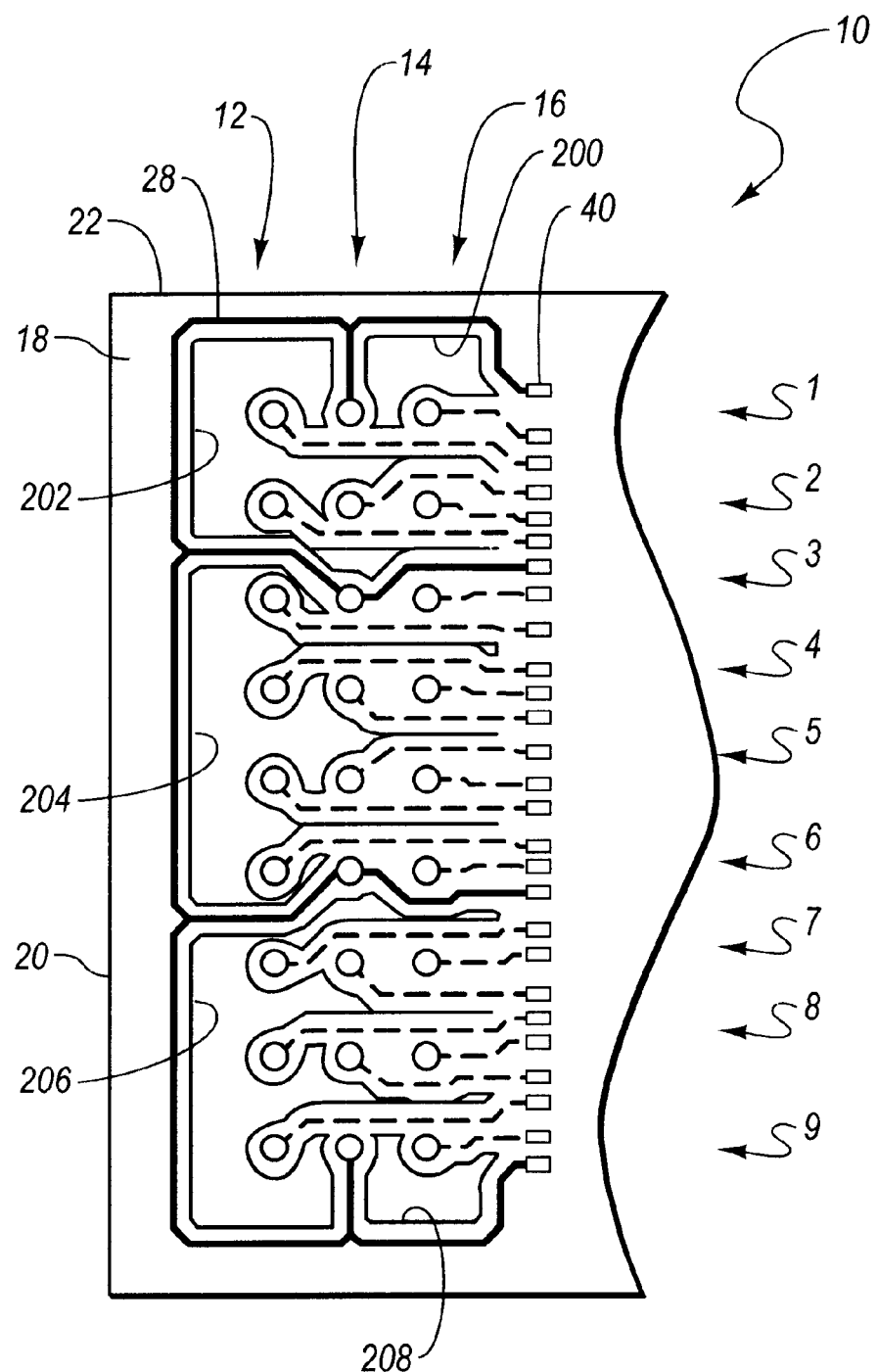
FIG. 3 illustrates the detail study of the ball array and trace layout depicted in FIG. 2 after the placement of buffer traces that either partially encircle or lie proximate to adjacent bond wire pads.

FIG. 3 is a depiction of the ball array and signal and ground trace layout 10 depicted in FIG. 2 after the addition of several occurrences of buffer traces 200–208. Each occurrence of buffer traces 200–208 is depicted as a solid line having a width that is smaller than the width of ground trace 28. Additionally, each occurrence of buffer traces 200–208 are depicted as closed loops, but they may be configured as open circuits for a specific application.

In FIG. 3, five occurrences of a buffer trace are depicted. For the occurrence of buffer trace 200 that is proximate to two occurrences of ball pad 24 located in the first row and middle 14 and inner 16 ball pad columns, it can be seen that buffer trace 200 lies proximate to both occurrences of the two ball pads 24. For the occurrence of buffer trace 202 that partially encompasses two occurrences of ball pad 24 depicted in the first and second row at outer ball pad column 12, it can be seen that buffer trace 202 also lies proximate to an occurrence of ball pad 24 located in the second row at middle column 14. For the occurrence of buffer trace 204 that partially encompasses four occurrences of ball pad 24 depicted in rows 3–6 at outer ball pad column 12, it can be seen that buffer trace 204 also lies two occurrences of ball pad 24 that lie within middle ball pad column 14 at rows 4 and 5. For the occurrence of buffer trace 206 depicted as mostly surrounding three occurrences of ball pad 24 that are located in the seventh, eighth and ninth rows in outer ball pad column 12, this occurrence of buffer trace 206 also lies proximate to two occurrences within middle ball pad column 14 in rows 7 and 8. Finally, it can be seen that buffer trace 208 lies proximate to two occurrences of ball pad 24 in the ninth row and at middle 14 and inner 16 ball pad column.

Figure 4:
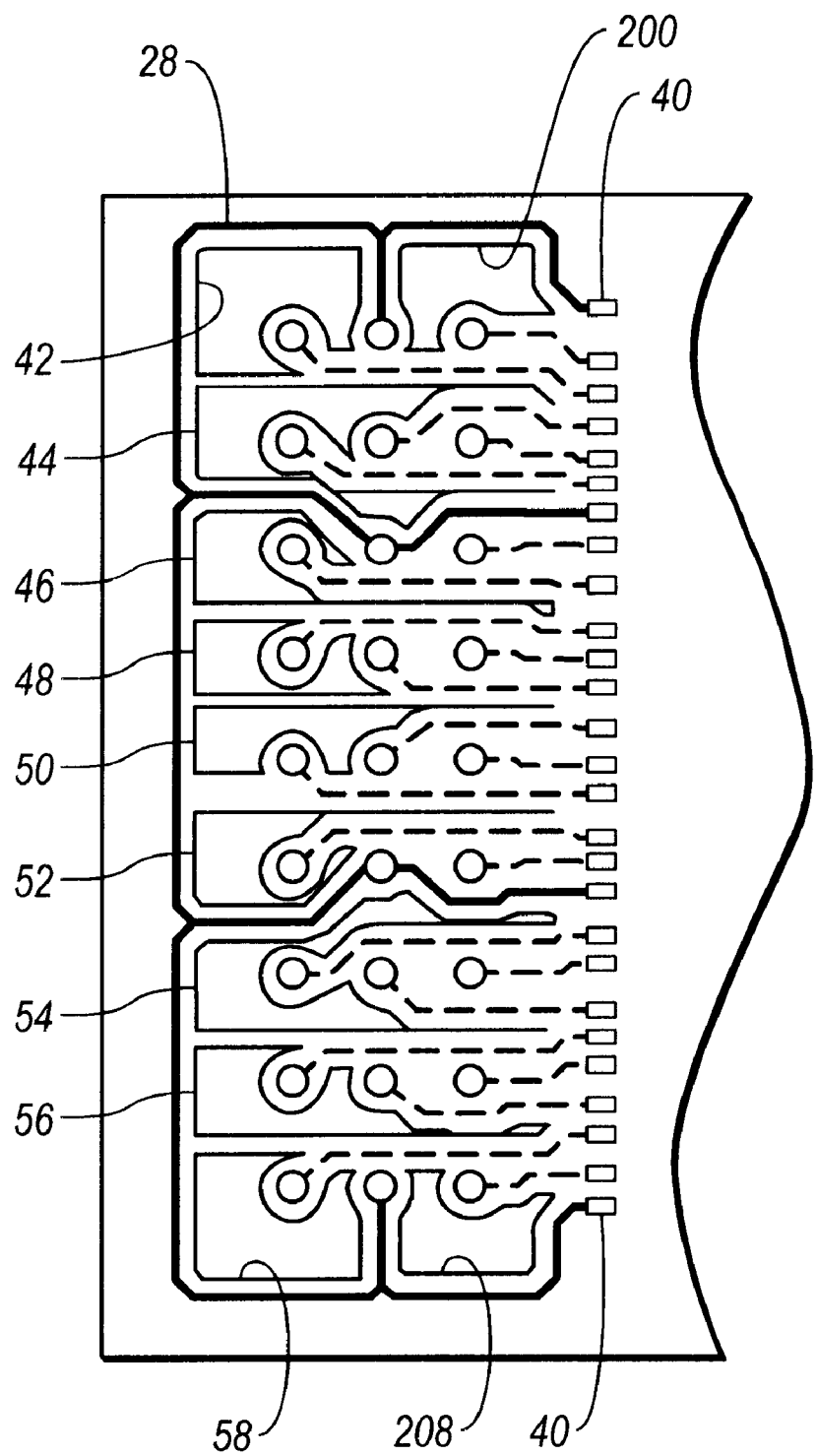
FIG. 4 is an alternative embodiment of the inventive ball array and trace layout depicted in FIG. 3 wherein the buffer traces are subdivided.

In an alternative embodiment of the present invention, the larger closed loops that make up buffer traces 200–218 may be selectively subdivided into smaller closed loops in order to achieve a preferred capacitative Delta for a given application. FIG. 4 is an illustration of this alternative embodiment wherein it can be seen that there are several occurrences of subdivided traces 42–58. It can also be seen in FIG. 4 that buffer traces 200 and 208 have not been altered but three buffer traces 202–206 seen in FIG. 3 have been altered to accomplish the formation of subdivided traces 42–58. The formation of a subdivided trace is preferable where a particular application requires the relative isolation of a ball pad in relation to an induced capacitance upon a buffer trace and therethrough an induced capacitance upon a ground trace.

Figure 5:
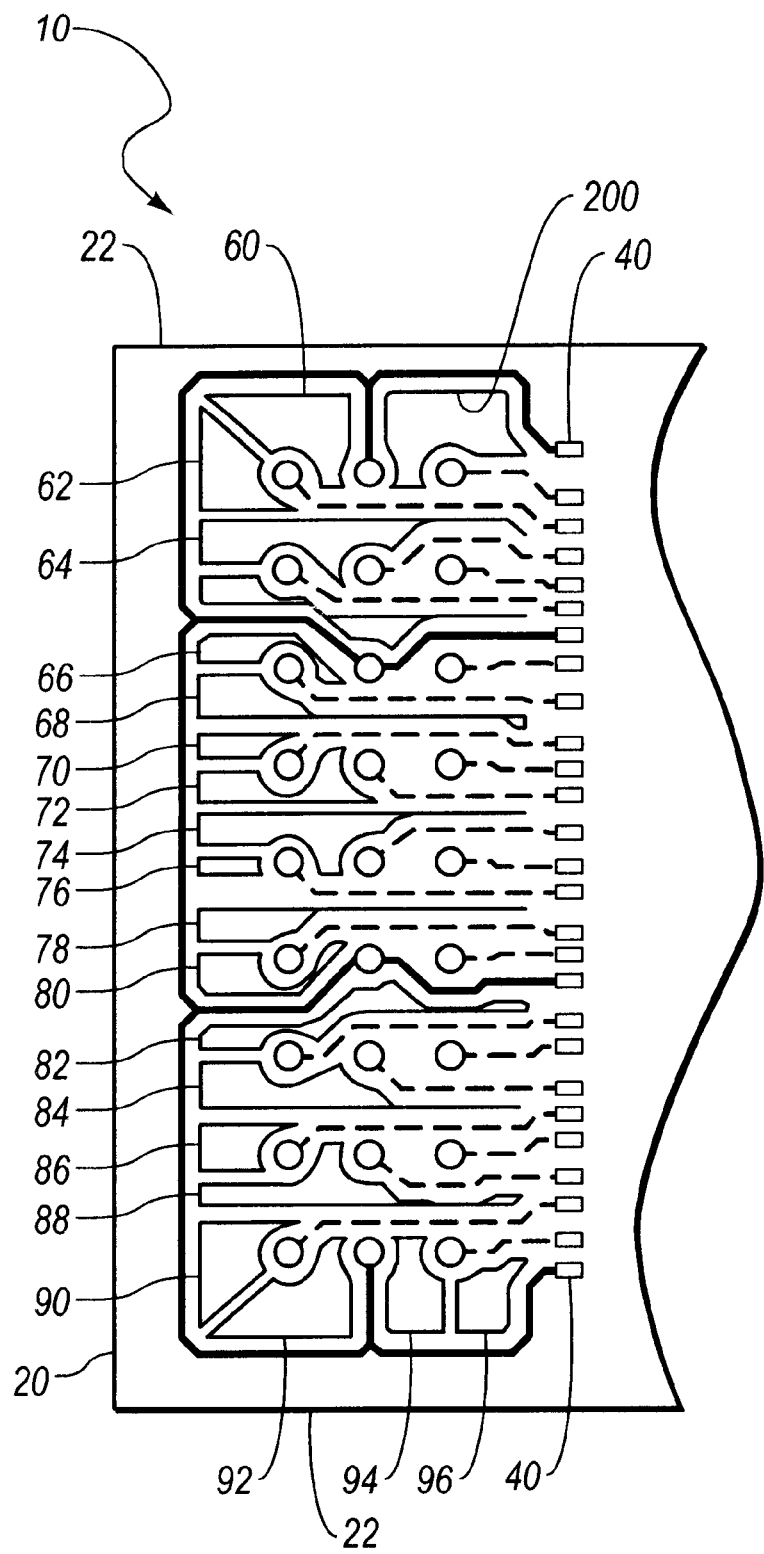
FIG. 5 is an alternative embodiment of the inventive ball array and trace layout depicted in FIG. 4, wherein the buffer traces are further subdivided.

FIG. 5 illustrates another alternative embodiment of the present invention wherein several occurrences of a subdivided and split trace 60 to 92 are depicted. FIG. 5 also illustrates the occurrence of buffer trace 200 as being substantially unaltered from the embodiments depicted in FIGS. 3 and 4 although it could also be subdivided or subdivided and split. A subdivided and split trace may be understood to have been derived from a subdivided trace. Buffer trace 208, depicted at the bottom in FIG. 3 is formed into subdivided and split traces 94, 96 as seen in FIG. 5. A split trace may be defined as a closed loop buffer trace that was formed from a larger closed loop buffer trace during the design process, and that preferably forms a split to form itself and a contiguous neighboring trace somewhere along an arc thereof that lies proximate and/or partially encircling of an occurrence of ball pad 24.

For each subdivided buffer trace, or for each subdivided and split buffer trace as described above, further refinement of achieving a preferred Delta may be done by leaving a given buffer trace as an open circuit instead of a closed loop. Thereby, the amount of electrically conductive material available to hold a capacitative charge, may be reduced in accordance with process goals.

Figure 6:
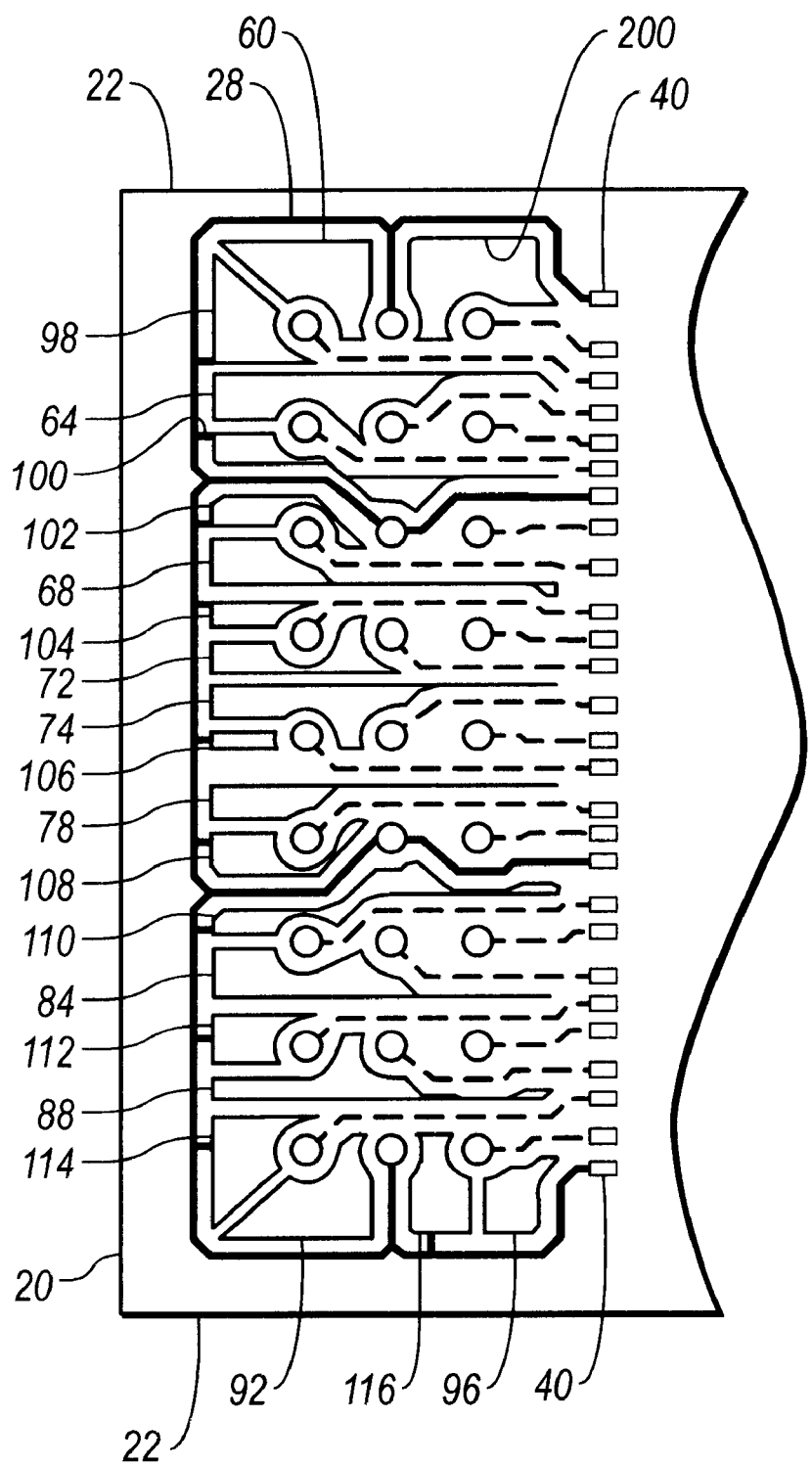
FIG. 6 is an alternative embodiment of the inventive ball array and trace layout depicted in FIG. 5, wherein at least one subdivided buffer trace that either partially encircled a ball pad of an outer ball pad column is selectively connected to a ground trace adjacent thereto.

The present invention also allows for selective tuning of the inventive ball array and trace layout by connecting or not connecting a buffer trace to ground trace 28. FIG. 6 illustrates another embodiment of the present invention where several occurrences of buffer traces are connected to ground trace 28. FIG. 6 illustrates that the occurrence of buffer trace 200 or any other buffer trace may not be altered from the original inventive ball array and trace layout of buffer traces. FIG. 6 also illustrates several occurrences of subdivided and split traces 60, 64, 68, 72, 74, 78, 84, 88, 90 and 92. FIG. 6 also illustrates the possible occurrence of split trace 96.

A buffer trace can be electrically grounded or ungrounded, the latter being referred to herein as "floating". Where selective tuning of a given ball array and trace layout is required in order to achieve a preferred capacitative Delta, several occurrences of a grounded buffer trace 98 through 116 may be applied to the inventive ball array and trace layout. A grounded buffer trace such as grounded buffer trace 100 is depicted as having a connection between ground trace 28 and what was previously a floating buffer trace.

According to the present invention, several combinations can be achieved by grounding or not grounding any occurrence of any type of buffer trace. For example, a buffer trace 200 may or may not be grounded. Similarly, a subdivided buffer trace such as any occurrence of subdivided buffer traces 42–58 seen in in FIG. 4 may or may not be grounded. Similarly, any occurrence of a subdivided and split trace may or may not be grounded such as any occurrence of subdivided and split trace 60–92 seen in FIG. 3 to achieve any number of occurrences of a grounded buffer trace 98–116 seen in FIG. 6.

FIG. 6 also illustrates the alternative embodiment of open circuit buffer traces. Subdivided and split trace 114 is a non-limiting example of an open circuit buffer trace connected to ground. Subdivided and split trace 92 is a non-limiting example of an open circuit buffer trace that is floating, or not connected to ground. The placement of open circuit buffer traces is also applicable to buffer traces that lie proximate to a plurality of ball pads 24.

Figure 7:
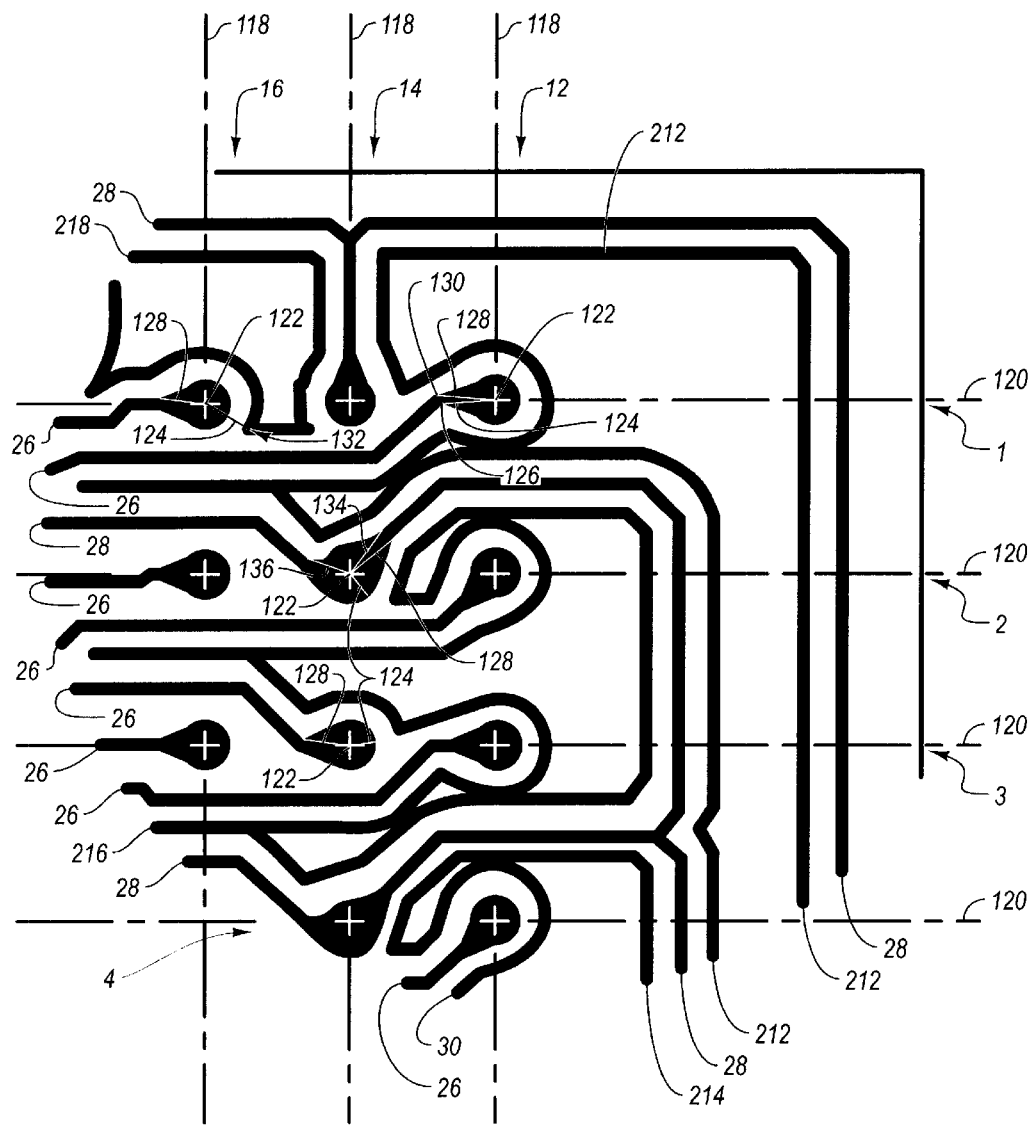
FIG. 7 is a detail section taken along the section line 7—7 from FIG. 1.

FIG. 7 is a detail taken along the section line 7—7 in FIG. 1. The amount that a buffer trace partially surrounds or proximately borders a ball pad will now be described. For example, a center 122 of ball pad 24 may be arbitrarily ascribed as the intersection between a horizontal pitch center line 118 and a vertical pitch center line 120. Center 122 is therefore the intersection therebetween. As such, center 122 forms the origin of measurement to determine the amount that a given occurrence of ball pad 24 is either partially surrounded or proximately bordered by the perimeter of at least one buffer trace. Where there is a single occurrence of a buffer trace that partially surrounds ball pad 24, such as ball pad 24 depicted in row 1 and at outer ball pad column 12, the amount that ball pad 24 is partially surrounded is determined by the placement of a first line 124 from center 122 to a first neck side 126 and by drawing a second line 128 from center 122 to a second neck side 130 of ball pad 24. The amount that buffer trace 212 partially surrounds ball pad 24 is then determined by an angle measured from first line 124 to second line 128, which is approximately 344°. As such, the amount that buffer trace 30 partially surrounds ball pad 24 is about 96% of 360°. A preferred amount range is from about 96% to about 80%, more preferably from about 96% to about 90%.

Where an occurrence of ball pad 24 is partially surrounded or approximately bordered only on one side thereof by buffer trace 218 such as the occurrence of ball pad 24 located in first row at inner ball pad column 16, the same technique may be used to determine the amount that ball pad 24 is either partially surrounded or proximately bordered by buffer trace 218. First line 124 is drawn from center 122 between center 122 and a portion of buffer trace 218 at buffer trace line bend 132. The angle is measured from first line 124 to second line 128. As such, the amount that ball pad 24 is partially surrounded or proximately bordered by buffer trace 218 is approximately 59%. A preferred amount range is from about 40% to about 70%, preferably from about 45% to about 65% and most preferably from about 50% to about 60%.

Some occurrences of ball pad 24 may be proximately bordered by two separate occurrences of ground traces, such as ball pad 24 located in the second row at middle ball pad column 14 which is proximally bordered by buffer traces 212 and 216. Measurement of the amount that ball pad 24 that is proximately bordered by buffer traces 212 and 216 is similarly measured by taking two measurements. First, a first line 124 is traced from center 122 toward a buffer trace line bend 132 where the perimeter of buffer trace 216 abruptly departs from lying parallel to ball pad 24. A second line 128 originates at center 122 and terminates at second line neck side 130. An angle is measured by sweeping, beginning at first line 124 and ending at second line 128. The perimeter of ball pad 24 encompassed within this angle, constitutes a first amount that ball pad 24 is proximately bordered by buffer trace 216. A second amount that ball pad 24 is proximately bordered by buffer trace 216 is measured by drawing a third line 134 away from center 122 and a fourth line 136 and by sweeping an angle between third line 134 and fourth line 136. The perimeter of ball pad 24 encompassed within this angle, constitutes a second amount that ball pad 24 is proximately bordered by buffer trace 216. As such, the amount that ball pad 24 is proximately bordered by two occurrences of buffer traces 212 and 216 is about 56%. A preferred amount range is from about 35% to about 75%, more preferably from about 45% to about 65%, and most preferably about 55%.

In inner ball pad column 16, FIG. 7 illustrates two occurrences of signal trace 26, located in row 2 and row 3 wherein the closest proximate traces thereto are either ground trace 28 or a signal trace 26. As such, these ball pads 24 are not considered to have any partial surrounding or proximal bordering of a buffer trace.

According to the present invention, where the greatest capacitance occurs in outer ball pad column 12, and where the smallest capacitance occurs in inner ball pad column 16, due to the congested nature of traces in the area of inner ball pad column 16, the placement of buffer traces 212, 214, 216 so as to partially surround occurrences of ball pad 24 found in outer ball pad column 12 allows for the reduction of capacitance for such occurrences of ball pad 24. By lowering the capacitance of any given ball pad 24 in outer ball pad column 12 to a capacitance that is closer to the capacitance experienced in any ball pad 24 in inner ball pad column 16, the capacitance Delta therebetween is diminished according to the invention goals. Thereby, any capacitative Delta selected between a given two occurrences of ball pad 24 and their corresponding traces will be on the order from about 0.02 picoFarads to about 0.06 picoFarads.

Figure 8:
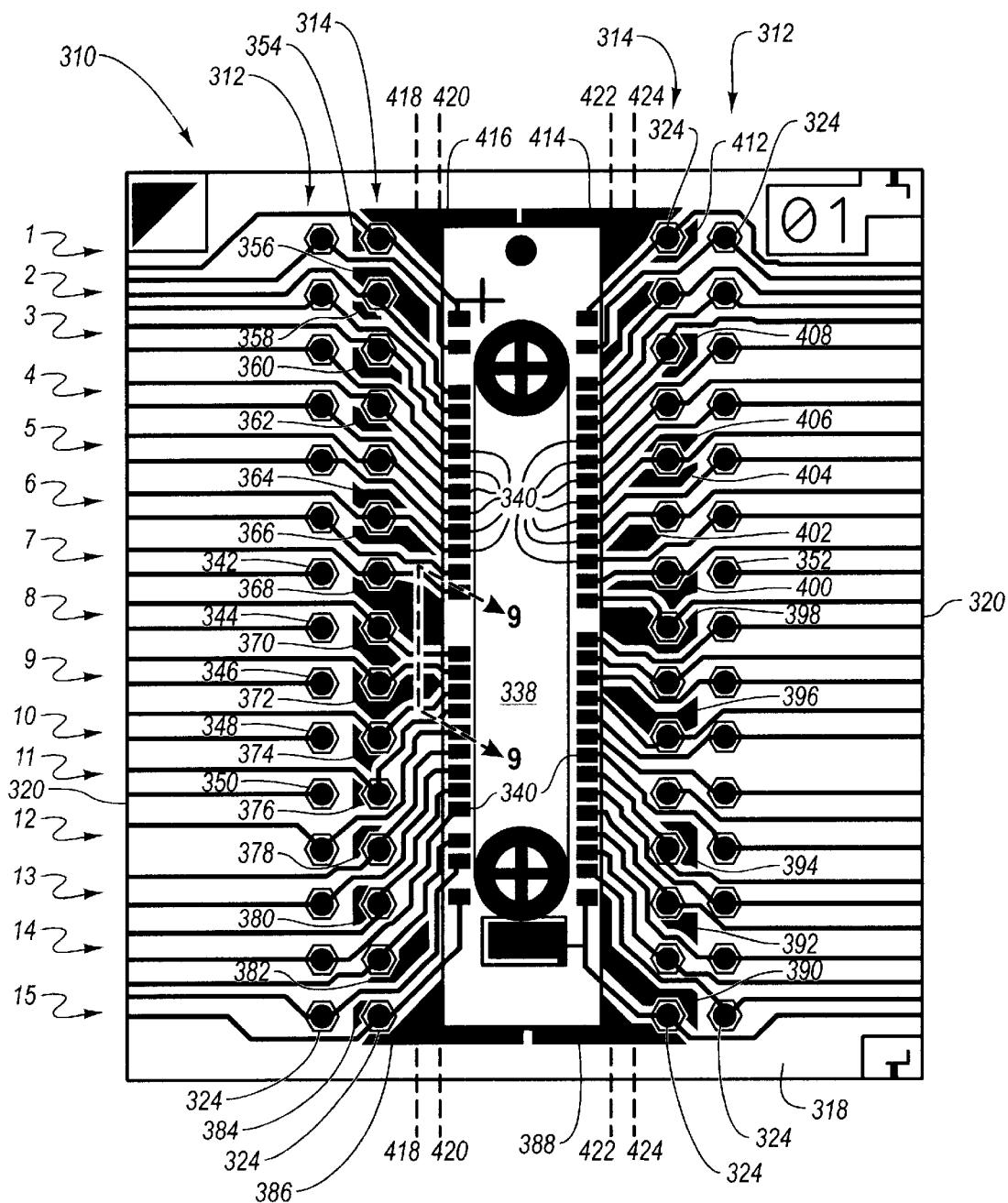
FIG. 8 is a plan view of another embodiment of the present invention.

FIG. 8 depicts another embodiment of the present invention. The embodiment uses a substrate 318 to support a ball array wiring layout 310. A plurality of ball pads 324 mark the locations for the termini of traces between each ball pad 324 and its corresponding bond wire pad 340. In this embodiment, some ball pads 324 may be unattached to any bond wire pads 340, as indicated by reference numerals 342–352. In FIG. 8, only a few of ball pads 324 and bond wire pads 340 are labeled, and vertical edges 320 are parallel to the centerline of outer ball column 312.

Typically, the asymmetrical molding technique may encapsulate a COB or a board on chip (BOC) package by having a mold cavity that has a larger area on one surface thereof than on the other surface thereof Further, injection of the encapsulation material is carried out by first filling one half of a mold cavity. The half of the mold cavity that is filled first has a larger surface area than the unfilled other half of the mold cavity. By filling the larger surface area mold cavity half first, encapsulation material in the larger surface area mold cavity half will apply pressure to the smaller surface area mold cavity half under conditions sufficient to cause a sealing engagement between the substrate and the smaller surface area mold cavity half. Alternatively, the filled first mold cavity half provides resistance points to external pressure that may be applied from the portion of the mold that forms the smaller surface area mold cavity half.

In the foregoing embodiment, encapsulation material may be standard thermoplastic, thermoset resins, and will preferably be a thermal grease. The thermal grease may be covered with a protective shell that is preferably composed of a thin metal or other highly thermally conductive material that allows for good thermal coupling to the thermal grease.

By way of non-limiting example, ball array wiring layout 310 depicted in FIG. 8 includes fifteen (15) ball rows of two balls per row, as indicated to the left and the right of a slot 338, wherein the 15 ball rows are arrayed in an outer ball column 312 and an inner ball column 314. Slot 338 is an elongated, symmetrical opening in substrate 318. Slot 338 has a major axis that is parallel to one of the two sets of parallel vertical edges 320. Asymmetrical overmolding causes encapsulation material to flow through slot 338 and across bond wire pads 340. The encapsulation material must then stop somewhere along mold clamp lines 418–420 for the left side of substrate 318, and must also stop along mold clamp lines 422–424 for the right side of substrate 318.

Disposed upon substrate 318 are several buffer traces 354–416. FIG. 8 illustrates that where at least one buffer trace is disposed upon substrate 318, outer ball column 312 is closer to that portion of the periphery, namely vertical edges 320, than any of the at least one buffer traces. In other words, buffer traces 354–416 are closer to slot 338 than outer ball column 312, and outer ball column 312 is closer to vertical edges 320 than buffer traces 354–416.

In this embodiment of the invention, an example of which is seen in FIG. 8, buffer traces 354–416 serve two purposes. First, buffer traces 354–416 lower the capacitative Delta as set forth above. Buffer traces 354–416 may be "floating" or grounded as set forth above. Second, buffer traces 354–416 are formed after routing of signal traces in order to fill spaces between signal traces. This filling of spaces between traces is performed to a degree such that the spacing between any trace and an adjacent trace, as viewed along any one of mold clamp lines 418–424, will resist the flow of encapsulation material across mold clamp lines 418–424 so that the encapsulation material will flow onto ball pad columns 312 and 314.

Buffer traces 356, 366, 368, 372, 382, 386, 388, 390, 396, 398, 400, 402, 404, 410, and 416 have portions thereof that intersect across at least one of mold clamp lines 418–424. Of particular note are buffer traces 386, 388, 414, and 418. These buffer traces cover a large area that intersects mold clamp lines 418–424 and act to seal the mold against substrate 318.

Figure 9A:
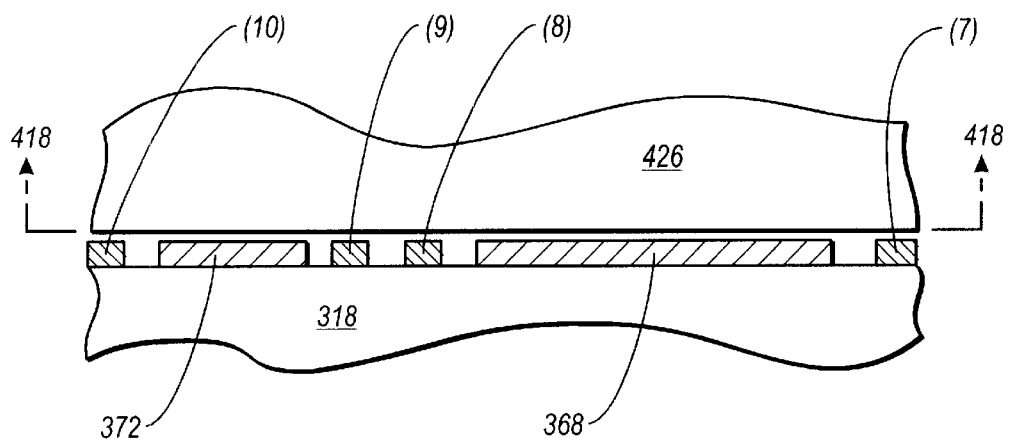
FIG. 9A is a detail elevational cross-section view taken along the section line 9—9 from FIG. 8.

Mold clamp lines 418–424 represent only a few examples of where a mold may be clamped between slot 338 and inner ball column 314 to prevent the flashing of encapsulation material out of a mold and onto ball pads 24 of inner ball column, and out of outer ball column 312. The resistance to encapsulation material flow is further illustrated in FIGS. 9A and 9b. FIG. 9A is taken from FIG. 8 along the section line 9—9. Substrate 318 has four traces 10–7 disposed thereon that are connected to ball rows 10–7, respectively, when viewed in FIG. 9A from left to right. Buffer traces 372 and 368 are seen to be uniformly narrowing spaces between traces 10 and 9, and between 8 and 7, respectively.

Figure 9B:
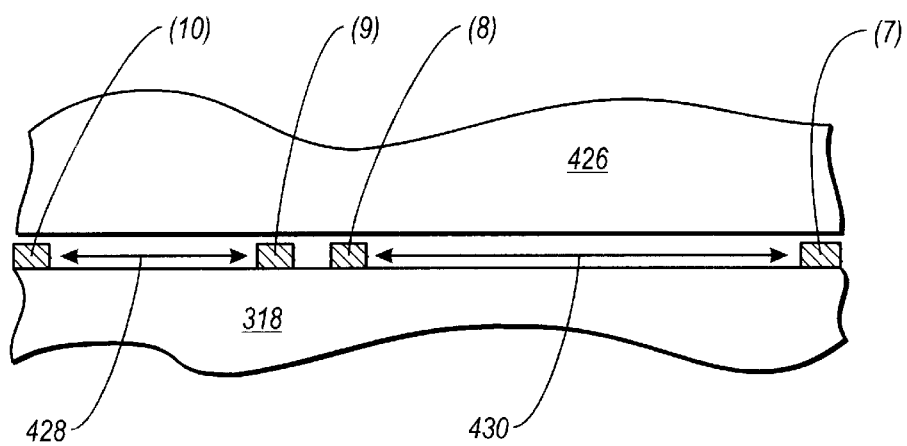
FIG. 9B is an elevational cross-section view of FIG. 9A wherein buffer traces have been removed.

FIG. 9B illustrates substrate 318 before the placement of buffer traces 368 and 372. Where asymmetrical molding is done without any buffer traces according to a comparative example to this embodiment, although a clamping section of a mold 426 may be clamped over traces 7–10, distances 428 and 430 between traces 10, 9, and 8, 7, respectively, create openings between substrate 318 and mold 426 that are sufficiently wide to allow encapsulation material to flash through the openings, past the region associated with clamp lines 418–424 (see FIG. 8), in the direction away from slot 338, and onto ball pads 324 associated with inner ball pad column 314. It is also possible that the encapsulation material will flow further onto the ball pads 342 associated with outer ball pad column 312.

Openings between substrate 318 and mold 426 are smaller, as seen in FIG. 8 with the presence of buffer traces 368 and 372, or as seen in FIG. 8 with the presence of buffer traces 356, 366, 368, 372, 382, 386, 388, 390, 396, 398, 400, 402, 404, 410, and 416. Consequently, the viscosities and surface tensions as well as other rheological qualities of encapsulation materials while flowing under sufficient pressures to cause the inventive asymmetrical overmolding to occur, prevent the encapsulation material from flashing through the openings so as to foul the respective inner and outer ball pad columns 314, 312.

One of ordinary skill in the art will now appreciate that buffer traces depicted in FIGS. 1 and 3–6 may be combined with buffer traces depicted in FIGS. 8 and 9A to achieve another preferred embodiment of a capacitance Delta minimized ball array wiring layout as well as a substantial minimization of flashing along clamping lines during asymmetrical overmolding of the integrated circuit chip.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of minimizing a capacitance difference between electrically conductive elements of a circuit comprising:
   providing an array of electrical connection pads;
   providing a row of bond wire pads;
   routing a signal trace between each bond wire pad and at least one electrical connection pad;
   determining an electrical connection pad-ground trace capacitance between at least one electrical connection pad and at least one nearest ground trace; and
   providing at least one buffer trace having a perimeter that is adjacent to an electrical connection pad which has a higher electrical connection pad-ground trace capacitance than another electrical connection pad in the array.

2. A method of minimizing a capacitance difference between electrically conductive elements of a circuit according to claim 1, wherein the electrical connection pads are ball pads.

3. A method of minimizing a capacitance difference between electrically conductive elements of a circuit according to claim 1, wherein the electrical connection pad with a lower capacitance is proximally bordered by at least one of a ground trace or a signal trace.

4. A method of minimizing a capacitance difference between electrically conductive elements of a circuit according to claim 1, wherein at least one of the at least one buffer trace is not connected to ground.

5. A method of minimizing a capacitance difference between electrically conductive elements of a circuit according to claim 1, wherein at least one of the at least one buffer trace is not connected to ground, and wherein at least one of the at least one buffer trace is connected to ground.

6. A method of tuning a circuit layout to reduce capacitance differences between electrical connection sites, comprising:

providing an array of electrical connection sites;

providing a row of bond wire pads;

routing a signal trace between at least one bond wire pad and at least one electrical connection site in the array;

determining an electrical connection site-ground trace capacitance between each electrical connection site and a nearest ground trace;

providing at least one buffer trace having a perimeter that is adjacent to at least one said electrical connection site, wherein the at least one electrical connection site has a higher electrical connection site-ground trace capacitance than another electrical connection site in the array; and selectively connecting or not connecting at least a portion of the at least one buffer trace to a ground trace between the electrical connection site with the higher electrical connection site-ground trace capacitance.

7. A method of preventing the flashing of encapsulation material during overmolding of an integrated circuit chip disposed upon a substrate, the method comprising:

providing a substrate, wherein the substrate has two sets of parallel edges;

providing a ball array upon the substrate, wherein the ball array comprises a plurality of ball pads, each ball pad having a minimum diameter and being disposed linearly with at least two other ball pads, and wherein the ball array is configured in a rectangular space having a linear outer ball column that is parallel with one of said two sets of parallel edges;

providing a bond wire pad array having a plurality of bond wire pads that is less than or equal in number to the plurality of ball pads;

forming a plurality of signal traces, wherein a signal trace is disposed between each bond wire pad and a corresponding ball pad of the ball array; and forming a plurality of buffer traces between at least some of the signal traces to narrow spacing between at least two of said signal traces, wherein each buffer trace is no closer to a signal trace than a minimum distance, and wherein the minimum distance is less than the minimum diameter of said ball pads.

8. A method according to claim 7, further comprising:

disposing a mold having a linear periphery upon at least some of the signal traces and at least some of the buffer traces over the substrate, wherein the linear periphery is disposed upon at least some of the buffer traces.

* * * * *